United States Patent [19]

Sunami et al.

[11] Patent Number: 4,984,038
[45] Date of Patent: Jan. 8, 1991

[54] SEMICONDUCTOR MEMORY AND METHOD OF PRODUCING THE SAME

[75] Inventors: Hideo Sunami, Nishitama; Makoto Ohkura, Hachioji; Masanobu Miyao, Tokorozawa; Kikuo Kusukawa, Hachioji; Masahiro Moniwa, Kokubunji; ShinIchiro Kimura, Hachioji; Terunori Warabisako, Nishitama; Tokuo Kure, Kobubunji, all of Japan

[73] Assignee: Hitachi, Ltd., Tokyo, Japan

[21] Appl. No.: 194,980

[22] Filed: May 17, 1988

Related U.S. Application Data

[60] Division of Ser. No. 81,142, Aug. 3, 1987, Pat. No. 4,937,641, which is a continuation of Ser. No. 654,459, Sep. 26, 1984, abandoned.

[30] Foreign Application Priority Data

Sep. 28, 1983 [JP] Japan ................................. 58-177952
Dec. 28, 1983 [JP] Japan ................................. 58-246948

[51] Int. Cl.⁵ ..................... H01L 29/68; H01L 29/10; H01L 29/34; H01L 29/04
[52] U.S. Cl. .................................. 357/23.6; 357/23.4; 357/54; 357/59
[58] Field of Search ................ 357/23.6, 54, 59, 23.4

[56] References Cited

U.S. PATENT DOCUMENTS

| | | | |
|---|---|---|---|
| 4,434,433 | 2/1984 | Nishizawa | 357/22 |
| 4,462,040 | 7/1984 | Ho et al. | 357/23.4 |
| 4,713,678 | 12/1987 | Womack et al. | 357/23.6 |
| 4,751,557 | 6/1988 | Sunami et al. | 357/23.6 |

Primary Examiner—Rolf Hille
Assistant Examiner—Wael Fahmy
Attorney, Agent, or Firm—Antonelli, Terry, Stout & Kraus

[57] ABSTRACT

The side wall part of a recess dug in a Si substrate is used as the major part of the electrode surface of a capacitor, whereby the electrode area is enlarged without enlarging a plane area. Thus, a desired capacitor capacitance can be attained without increasing the breakdown of an insulator film ascribable to the conventional approach of thinning of the insulator film. In addition, a vertical switching transistor is formed on the Si substrate, whereby the Si substrate can be entirely utilized for the formation of the capacitor.

6 Claims, 18 Drawing Sheets

SEMICONDUCTOR MEMORY AND METHOD OF PRODUCING THE SAME

This is a divisional of application Ser. No. 081,142, filed Aug. 3, 1987, now U.S. Pat. No. 4,837,641, issued June 26, 1990, which is a continuation application of Ser. No. 654,459, filed Sept. 26, 1984, now abandoned.

BACKGROUND OF THE INVENTION

The present invention relates to a MOS memory employing insulated-gate field effect transistors (hereinbelow, termed "MOS transistors"), and more particularly to a one-transistor type dynamic random access memory.

D.RAMs employing MOS transistors have been quadrupled in scale every 3 years since a dynamic random access memory (hereinbelow, abbreviated to "d.RAM") of 1 kb was sold early in the 1970s. However, 16-pin DIPs (dual in-line packages) have been chiefly used as packages for receiving memory chips, and the sizes of cavities for putting the chips therein have been limited, so that the memory chips have been enlarged only to at most 1.4 times with the quadrupling of the scale. Accordingly, the memory cell area corresponding to 1 bit has descreased significantly with the enlargement of scale. Specifically, it has been reduced to about $\frac{1}{3}$ with the quadrupling of the scale. The capacitance C of a memory capacitor is expressed by $C = \epsilon A/t$ (where $\epsilon$: dielectric constant of an insulator film, A: area of the capacitor, t: thickness of the insulator film). Therefore, when the area A becomes $\frac{1}{3}$, the capacitance C becomes $\frac{1}{3}$ as long as the quantities $\epsilon$ and t remain unchanged. The quantity of a signal S as the memory capacitor is proportional to the quantity of charges Q, which is the product between the capacitance C and a voltage V. Therefore, as the area A decreases, the quantity of charges Q diminishes proportionally, and the signal S consequently becomes small.

Letting N denote noise, the S/N ratio lowers with the decrease of the signal S, which forms a serious problem during circuit operation. Accordingly, the decrement of the area A has been usually compensated for by the decrement of the thickness t. As the scale has been enlarged to 4 kb, 16 kb and 64 kb, the thickness of a typical SiO$_2$ film has been thinned to 100 nm, 75 nm and 50 nm by way of example.

Further, it has recently been verified that charges of about 200 fC at the maximum are generated within a Si substrate by $\alpha$ particles emitted from radioactive metals (U, Th etc.) contained in a package etc. and that they form noise. Because of this it has become difficult in to obtain a high reliability operation if the quantity of charges Q representing the quantity of a signal is rendered to a value less than approximately 200 fC.

It has accordingly been practised to thin the insulator film still more. For this reason, the dielectric breakdown of the insulator film has become a problem. The dielectric breakdown electric field of SiO$_2$ is at most 10$^7$ V/cm. Accordingly, an SiO$_2$ film being 10 nm thick is almost permanently broken down or is degraded by the application of 10 V. In addition, when the long-term reliability is considered, it is important to use an insulator film with a voltage which is smaller than the maximum breakdown voltage to the utmost.

FIG. 1 shows an arrangement diagram of the memory cell of a one-transistor type d.RAM. The memory cell is constructed of a capacitor 1 for storing charges, and a switching MOS transistor 2. The drain of the switching transistor is connected to a bit line 3, and the gate thereof to a word line 4.

The memory cell is operated in such a way that the signal charges stored in the capacitor 1 are read out by the switching transistor 2. In order to construct an actual memory of N bits, a memory array is arranged. Herein, broadly there are two methods to be described below. FIG. 2 shows the so-called "open bit line" arrangement in which bit lines 31 and 32 are arrayed on both the sides of a sense amplifier 5 for differentially deriving a signal. In this arrangement, only one bit line 31 electrically intersects one word line 41, and the difference of the signals of the bit lines 31 and 32 is detected by the sense amplifier 5.

FIG. 3 shows the other arrangement called the "folded bit line" arrangement. Two bit lines 31 and 32 connected to a sense amplifier 5 are arrayed in parallel, and one word line 41 intersects the two bit lines 31 and 32.

While the embodiments of the present invention to be described later will chiefly refer to the folded bit line arrangement, the invention is similarly applicable to the open bit line arrangement.

When, as indicated in FIGS. 2 and 3, $C_D$ denotes the capacitance of the parasitic capacitor 6 of the bit line 32 and $C_S$ denotes the capacitance of the capacitor 12 of a memory cell, one of the principal performance indices of this memory array becomes $C_S/C_D$. The S/N ratio of this memory array is in 1-to-1 correspondence with $C_S/C_D$. Not only increasing the capacitance of the capacitor of the memory cell, but also decreasing the parasitic capacitance $C_D$ of the bit line 32 results in enhancing the S/N ratio similarly.

FIG. 4 shows an example of the plane of the memory cell of the folded bit line system. A part of an active region (isolated region) 7 surrounded with a thick field oxide film for isolation, which is usually thicker than 100 nm, is covered with a plate 8 in order to form a capacitor. The plate is selectively removed from a portion 40 which includes a part for forming a switching transistor and a contact hole 9 for connecting a bit line electrode to a drain on a Si substrate. In this portion, word lines 41 and 42 are deposited, and the switching transistor 2 is formed. In order to facilitate understanding, FIG. 5 shows a sectional view of a part indicated by AA in FIG. 4.

Hereinafter, for the sake of convenience, transistors shall be exemplified as being of the n-channel type. In order to fabricate p-channel type transistors, the conductivity types of a Si substrate and diffused layers may, in general, be reversed to those in the case of the n-channel type.

On a p-type Si substrate 10 of approximately 10$\Omega$-cm, a field SiO$_2$ film 11 which is usually approximately 100–1000 nm thick is selectively formed by, e.g., the so-called LOCOS process which employs Si$_3$N$_4$ for an oxidation impermeable mask. Thereafter, a gate oxide film 12 which is 10–100 nm thick is formed on the Si substrate 10 by the thermal oxidation process or the like. Subsequently, a capacitor electrode 25 made of an n$^+$-type layer is formed by the selective doping of P or As. Subsequently, the plate 8 which is represented by polycrystalline Si doped with P or As is selectively deposited, and the plate 8 of the polycrystalline Si is oxidized to form a first inter-layer oxide film 13. Thereafter, a word line 4 which is typically made of polycrystalline Si, Mo silicide or a refractory metal (Mo or W) is deposited, and the ions of P, As or the like are implanted. Then, in those parts of the active region on which the plate 8 and the word line 4 are not deposited, n+-type diffused layers 15 are formed to serve as the source and drain of the switching transistor 2. Subsequently, PSG 14 which contains phosphorus and which is produced by the so-called CVD process is deposited by 500-1000 nm, the contact hole 9 is formed in a place where a bit line 3 represented by an Al electrode is to be connected to the diffused layer 15, and the bit line 3 is selectively deposited.

In this memory cell, the region 16 of the capacitor 1 to serve as the memory capacitor is a part indicated by oblique lines in FIG. 4. When the memory cell itself becomes small, also the part of the region 16 becomes small. As explained before, unless the gate oxide film 12 is thinned, the capacitor capacitance $C_S$ lowers, which is seriously problematic in the memory operation.

To the end of solving such problems, it has been proposed to form a recess in a semiconductor substrate and to utilize the recess for a capacitor (Japanese Patent Publication No. 56-48976, Japanese Patent Application Laying-Open No. 51-130178, and Japanese Patent Application Laying-Open No. 58-154256).

SUMMARY OF THE INVENTION

In order to cope with the serious aspects of the disturbance by α particles, the worsening of the S/N ratio and the problem of the dielectric breakdown voltage, which are attendant upon the microminiaturization of memory cells, the present invention provides an arrangement according to which, even when the memory cell is microminiaturized, the area A of a capacitor is held or increased without reducing the thickness of an insulator film.

The arrangement of the present invention to accomplish this consists in that the side wall part of a recess dug in a Si substrate is used as the major part of the electrode surface of a capacitor, whereby the electrode area is enlarged without enlarging a plane area. Thus, a desired capacitor capacitance can be attained without increasing the breakdown of an insulator film ascribable to the thinning of the insulator film. In addition, a switching transistor is formed on the Si substrate, whereby the Si substrate can be entirely utilized for the formation of the capacitor.

BRIEF DESCRIPTION OF THE DRAWINGS

FIGS. 6-43 are diagrams showing embodiments of the present invention, in which FIG. 6, FIG. 15, FIGS. 22-23, FIGS. 33-34, FIG. 37 and FIG. 43 are plan views, FIGS. 7-11, FIG. 13, FIGS. 16-18, FIGS. 24-26, FIG. 32, FIG. 35, FIG. 36 and FIGS. 38-42 are sectional views, and FIG. 12, FIG. 14, FIGS. 19-21 and FIGS. 27-31 are bird's-eye views.

DESCRIPTION OF THE PREFERRED EMBODIMENTS

Figure 4:
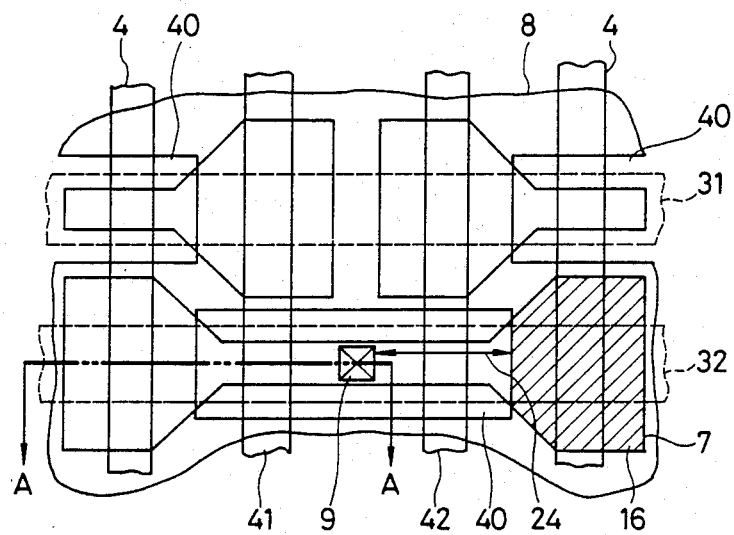
Figure 5:
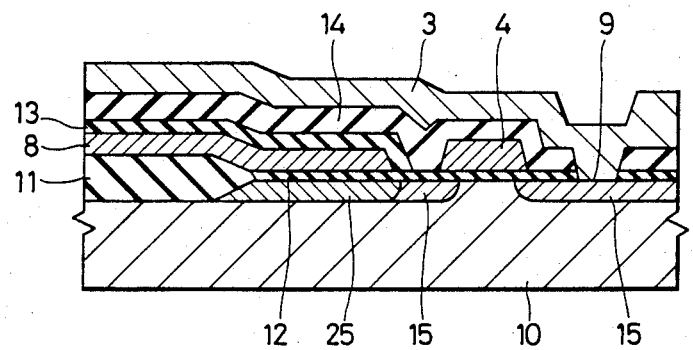
Figure 6:
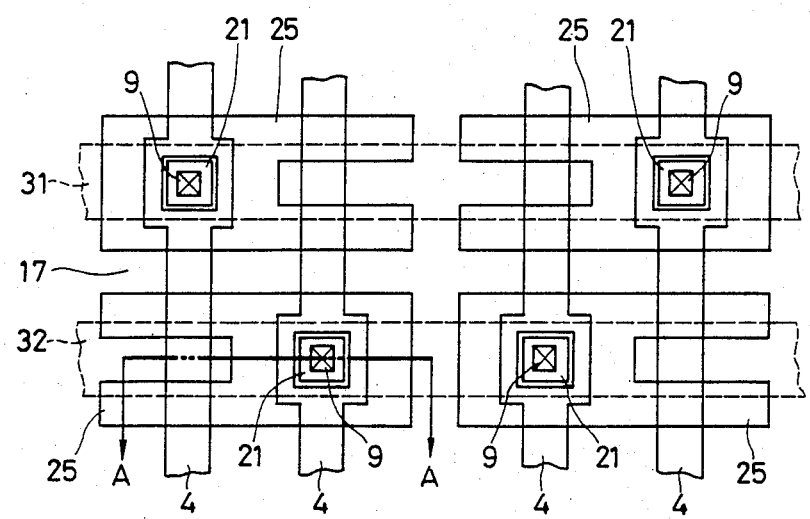

Now, the invention will be described in detail in conjunction with embodiments. First, FIG. 6 shows a plan view of one embodiment of the present invention. When compared with the prior-art memory cells shown in FIG. 4, the embodiment differs in that all capacitor electrodes 25 are formed so as to cover the whole front surface of a Si substrate and the vicinity thereof and that the channel portions of switching transistors 2 are formed by the use of the side walls of protrusive Si portions 21 which are stacked on the capacitor electrodes 25. Thus, as compared with the capacitor region 16 of the prior-art memory cell which has hitherto occupied only 30-40% of the whole plane as shown in FIG. 4, that of the embodiment is sharply enhanced and can occupy approximately 80-90% of the whole plane. Since, as described later, the capacitor region 25 utilizes the side wall part of a recess 17 dug in the Si substrate, the area of the capacitor electrode can be expanded independently of the plane area. It is intended to increase the side wall area so that the plane shape of the capacitor electrode 25 is rendered concave in FIG. 6.

Figure 7:
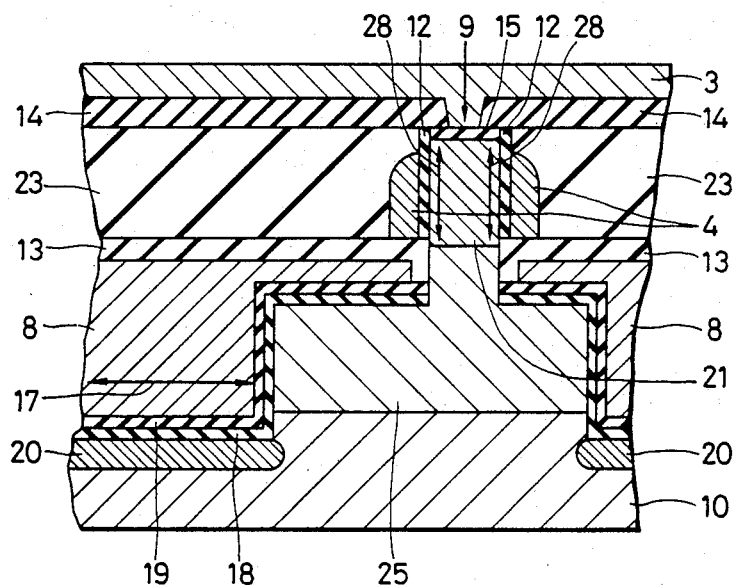

FIG. 7 shows the section AA of the plane pattern depicted in FIG. 6. A plate 8 is buried in the recess 17 dug in the Si substrate 10, through a capacitor $SiO_2$ film 18 as well as a capacitor $Si_3N_4$ film 19. A part of the plate is removed, and the Si protrusion 21 is disposed on the capacitor electrode 25 of the n+-type layer through the removed part. A word line 4 serving as a gate is formed along the protrusion 21 through a gate oxide film 12. A bit line 3 is electrically connected to an n+-type diffused layer 15 through a contact hole 9. Thus, the switching transistor 2 can use the side wall of the Si protrusion 21 as the channel portion 28 thereof. According to the present invention, the distance 24 between the capacitor region 16 and the contact hole 9 as already indicated in FIG. 4 becomes unnecessary, which is very advantageous for enhancing the density of memory cells. Particularly the mask registration margins between the contact hole 9 and the word line 4 and between the word line 4 and the capacitor region 16 form serious factors for hampering the enhancement of the density of memory cells, and it is an important feature of the present invention that they are quite unnecessary in plan.

Now, the manufacturing process of the present invention will be described in detail. First, as shown in FIG. 8, an n+-type layer 25 whose impurity concentration is on the order of $10^{17}$–$10^{21}$ atoms/$cm^3$ is formed in the whole surface of a Si substrate 10 and to a depth of 4 μm by the thermal diffusion process of P, As, Sb or the like or the ion implantation process + annealing, which is well known.

Figure 8:
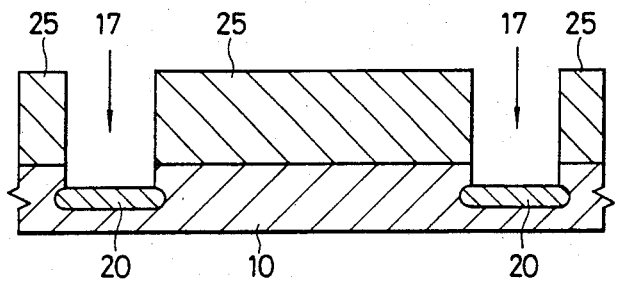

Thereafter, as shown in FIG. 8, etched recesses 17 are formed in predetermined parts of the Si substrate 10 by the parallel-plate type plasma etching in which the gas of F or Cl, for example, $CF_4$, $SF_6$ or $CCl_4$ or a gas further containing H is employed as a principal constituent. As the mask of this plasma etching, the conventional photoresist itself is sometimes etched to disappear. Therefore, films of $SiO_2$, $Si_3N_4$ and CVD $SiO_2$ in this order are successively deposited on the Si substrate 10 of the structure shown in FIG. 8 beforehand. After the uppermost layer of CVD $SiO_2$ is etched using a photoresist mask, the underlying layers of $Si_3N_4$ and $SiO_2$ are etched. The Si substrate 10 may be etched using the resultant mask. In finally removing the CVD $SiO_2$ for the mask, the $Si_3N_4$ film prevents field $SiO_2$ films for the transistors of another circuit, not shown in the figure, from being etched. Accordingly, it may well be replaced with a different film as long as this purpose is met. At least, the three-layer film of CVD $SiO_2$/$Si_3N_4$/$SiO_2$ is a mask material, and it is removed in due course and does not remain on the Si substrate. Therefore, insofar as the purpose is met, the mask material is not restricted. Alternatively, when a very fine beam is employed, the desired etched recesses 17 can be formed without any mask material.

In principle, the depth of the etched recess 17 is hardly limited. It is actual, however, that the depth $D_M$ is approximately 1-10 times greater than the width $W_M$ of the recess. In addition, the upper end part of the recess has an acute corner, and the dielectric breakdown voltage lowers due to electric field concentration in some cases. Therefore, the corner may be rounded by isotropic etching such as wet etching before the recess is formed deep. This recess 17 serves also for isolation. Therefore, in case of using the Si substrate 10 which is usually of 10Ω-cm, boron is ion-implanted into the bottom of the recess 17 within a range of $1 \times 10^{11} - 1 \times 10^{13}$ cm$^{-2}$, followed by annealing at 900°-1000° C., whereby a heavily-doped layer 20 for isolation is formed. In a case where the impurity concentration of the Si substrate 10 is high enough to prevent the leakage current between adjacent capacitor electrodes 25, or in a case where an SOS (Si On Sapphire) substrate, for example, with which the whole n+-type layer 25 to form the capacitor electrodes is formed on an insulator film is employed, the heavily-doped isolation layer 20 need not be formed especially additionally.

Thereafter, the insulator film of capacitors is formed. In principle, the material of this insulator film is not specified as long as it has a high withstand voltage is electrically stable. Materials heretofore used include thermal oxidation SiO$_2$, thermal nitridation Si$_3$N$_4$, CVD Si$_3$N$_4$, and Ta$_2$O$_5$, Nb$_2$O$_5$, TiO$_2$ and GrO$_2$ produced by CVD or reactive sputtering. A single layer or a plurality of layers of such materials can be used as the capacitor insulator film. The present embodiment will refer to a case of employing a stacked film made of SiO$_2$ and Si$_3$N$_4$.

Unlike the case of wet etching, the recesses formed in the Si substrate 10 by the dry etching (such as plasma etching or sputter etching) give the Si substrate 10 electrical and crystallographic damages and contamination more or less. Accordingly, after the dry etching, wet etching may be performed by approximately 10-500 nm until the damages and contamination become, in effect, no problem. As an etchant, the aqueous solution of an NH$_4$OH+H$_2$O$_2$ system or an HF+HNO$_3$ system conforms well to this purpose.

Figure 9:
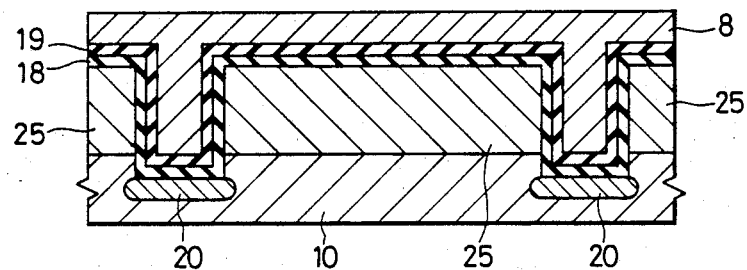

After the surfaces of the Si substrate 10 and the recesses 17 have been removed by this wet etching, the capacitor SiO$_2$ film 18 being 5-20 nm thick is formed by the well-known thermal oxidation at 900°-1200° C. in an oxidizing atmosphere, as illustrated in FIG. 9. Thereafter, the capacitor Si$_3$N$_4$ film 19 is deposited to a thickness of 5-20 nm by the CVD process at 650°-850° C. Since the thicknesses of these films are set in consideration of a capacitance per unit area and a breakdown voltage as desired, they sometimes depart from the thickness range specified above. In general, the CVD Si$_3$N$_4$ 19 has an internal stress reaching $1 \times 10^{10}$ dyn/cm$^2$ and is stout. Therefore, when it is deposited directly on the Si substrate 10, defects arise to spoil characteristics. Accordingly, it is common practice to lay the SiO$_2$ under the Si$_3$N$_4$. This does not apply to a case where the Si$_3$N$_4$ film is formed by directly nitrifying the Si substrate 10, and a dense film of high breakdown voltage can be obtained in the case. However, a reaction time in excess of 1 hour is required for producing a film thicker than 10 nm. Moreover, the increase rate of the thickness lowers abruptly when the thickness of 10 nm is exceeded. Therefore, the direct nitridation is not proper for producing the thick film. In addition, the Si$_3$N$_4$ film 19 is favorable in that when the surface thereof is thermally oxidized by 2-5 nm, the pinhole parts thereof are thickly oxidized, so the dielectric breakdown voltage can be enhanced, and besides, in the dry etching of polycrystalline Si to be formed thereon, the oxide layer serves as a stopper against overetching. Thereafter, a plate 8 represented by the polycrystalline Si is deposited on the whole surface. Since the polycrystalline Si deposited by the CVD process precipitates turning into the recess 17 well, the film of the polycrystalline Si on the side wall of the recess 17 becomes substantially the same thickness as that of the film of the polycrystalline Si on the upper surface. Thereafter, this polycrystalline Si is thermally diffused with P by the use of POCl$_3$ gas or the like. In a case where the depth of the recess is as great as 5 µm, diffusion at a high temperature for a long time is required for causing the P to reach the bottom of the recess 17. Therefore, the recess 17 may be filled up as illustrated in FIG. 9 in such a way that polycrystalline Si in a first operation is previously deposited to a thickness not filling up the recess, namely, below ½ of the recess width $W_M$, whereupon the thermal diffusion is performed once, and that polycrystalline Si in a second operation is deposited.

Figure 10:
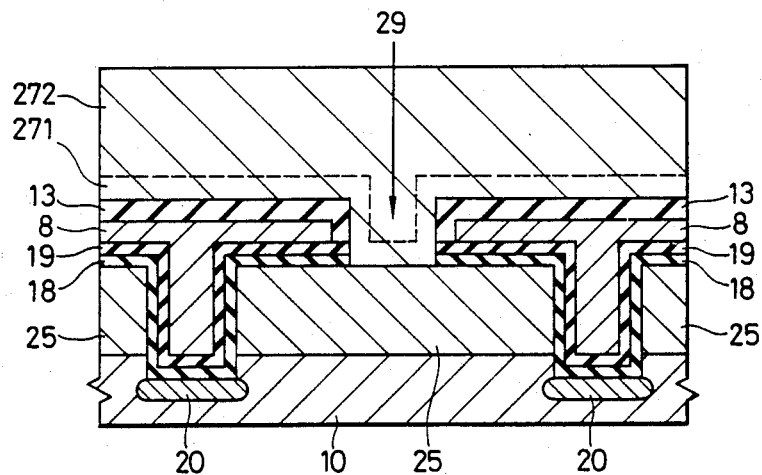

Thereafter, as shown in FIG. 10, a substrate contact hole 29 and the plate 8 are formed by the photoetching process, and the latter is oxidized to obtain a first inter-layer oxide film 13 which is 100-400 nm thick. On this occasion, the Si$_3$N$_4$ film 19 is hardly oxidized. Subsequently, using the thick first inter-layer oxide film 13 as a mask, the Si$_3$N$_4$ film 19 and the thin SiO$_2$ film 18 are removed by etching, and an SOI (Si-On-Insulator) layer 27 (271, 272) is formed on the resultant substrate. In the etching operation, the Si$_3$N$_4$ film 19 is etched using the first inter-layer oxide film 13 as the mask and by, e.g., the plasma etching in which hot phosphoric acid at 180° C. or a Freon gas such as CF$_4$ is employed as a principal constituent, and further, the capacitor SiO$_2$ film 18 is etched with an HF-based etchant. In addition, the SOI layers 271 and 272 are formed as stated below. Polycrystalline Si is deposited on the whole structure to a thickness of approximately 100-1000 nm by employing SiH$_4$ or SiH$_2$Cl$_2$ gas or the like as is well known. Thereafter, while the whole Si substrate 10 is held at a predetermined temperature from the room temperature to 1000° C., a light beam in the shape of a spot 10-100 µm in diameter or in the shape of a rectangle is projected on the whole surface of the polycrystalline Si film at an energy level of 5-20 W and at a scanning rate of 10-100 cm/sec by the use of a CW-Ar laser. Then, the polycrystalline Si produces single-crystal Si having radii of 20-50 µm or more from its part contacting the Si substrate 10, that is, the epitaxial layer (SOI layer) 271 on the insulator film.

Although the use of the so-called laser epitaxy (single-crystallization by laser annealing) employing the CW laser has been exemplified here, only the channel portion 28 of a switching transistor 2 may finally become a single crystal, and any method of annealing with a carbon heater, annealing with an electron beam, the MBE (Molecular Beam Epitaxy) process, etc. can be used instead of the laser epitaxy.

The Si film which is previously deposited before the laser annealing is not restricted to the polycrystalline Si, but the conventional epitaxial growth at 800°-1200° C. can also be employed. In this case, only the vicinity of the contact hole 29 having a diameter of 2-3 µm becomes a single crystal, and the surrounding part becomes polycrystalline. Therefore, the entire polycrystalline layer or at least a part corresponding to the transistor channel portion 28 may be subsequently single-crystallized by the aforementioned annealing.

In the present invention, the method for growing the single-crystal Si on the insulator film is not especially restricted. However, laser epitaxy and molecular beam epitaxy suited for producing the SOI layer 27 of good quality are, in general, unsuited for producing the thick SOI layer 27. For this reason, the first SOI layer 271 is previously formed to a thickness of 100-500 nm by either of these methods. The second SOI layer 272 which is thick is formed on this SOI layer 271 by the conventional thermodecomposition of SiH4 or vapor reaction process of SiCl4 or SiH2Cl2. As a result, the thick SOI layer 27 having a thickness of 1-5 μm can be obtained.

Figure 11:
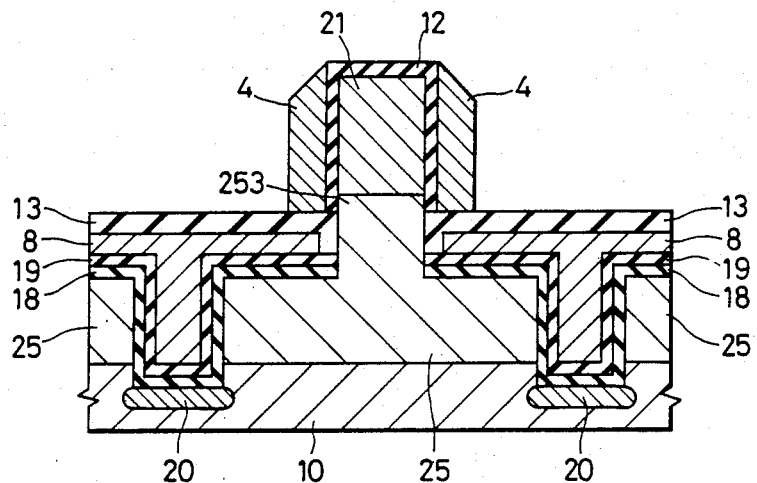

Thereafter, as illustrated in FIG. 11, the SOI layer is etched by the well-known photolithography or the like and has its unnecessary parts removed so as to leave at least a pillar-shaped Si protrusion 21 which forms the switching transistor.

Any process for etching Si can be employed for this etching. It is possible to perform the wet etching with an HF-HNO3 system, the plasma etching employing CF4 or SF6 gas or the like as a principal costituent, or anisotropic etching employing KOH, hydrazine or the like with which the etching rate of the (111) plane is especially low. Particularly with the anisotropic etching, when the SOI layer 27 has an upper surface of the (100) plane, it is formed into a trapezoid having a wider lower end at about 55 degrees (the angle defined between the (100) plane and the (111) plane). The gentle end part of the SOI layer has the advantage that various films to be deposited thereon are easy to form.

The present embodiment has been explained as to the case where the Si protrusion 21 is vertically formed as shown in FIG. 11. Thereafter, a gate oxide film 12 is formed by the well-known thermal oxidation process or the like, boron is ion-implanted to an amount necessary for attaining a desired threshold voltage $V_{TH}$, and a word line 4 is selectively deposited.

In order to deposit on the side surfaces of the Si protrusion 21 the word line 4 which is typically made of polycrystalline Si, or W or Mo, or a silicide such as WSi2, MoSi2 or TiSi2 and which serves as the gate of the switching transistor 2, a film of the aforementioned material is first deposited on the whole surface, and it is etched by directive dry etching. Then, the gate is left on only the side surfaces of the protrusion 21 as illustrated in FIG. 11. In actuality, the memory cells are in the shape of a matrix, and the word lines 4 of the adjacent memory cells need to be connected as shown in FIG. 6, so that a resist needs to be deposited on a part necessary for the connection by photolithography or the like. Besides, the n+-type layer 25 is, in effect, lengthened by the heat treatment and rises as indicated by numeral 253.

Figure 12:
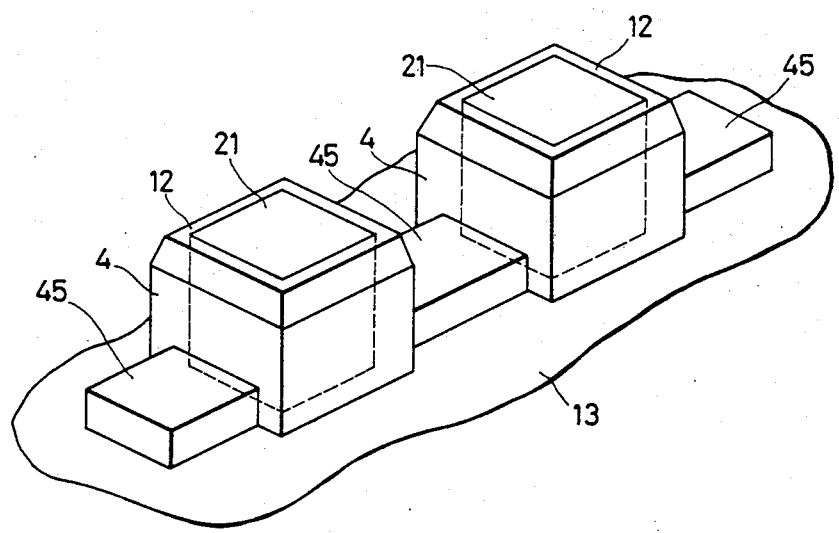

FIG. 12 shows a bird's-eye view of the state in which the word lines 4 of the two memory cells are connected by the connecting part 45.

Figure 13:
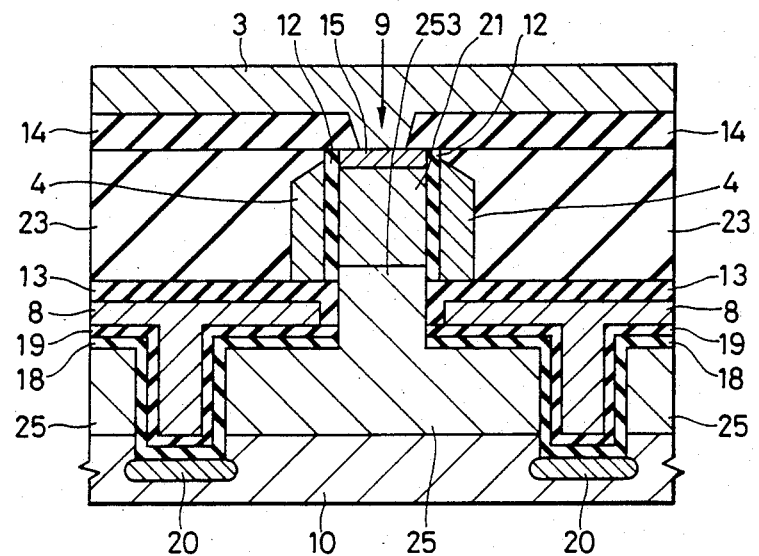

Thereafter, as shown in FIG. 13, a filling insulator film 23 typically made of SiO2 containing or not containing P is deposited by the bias sputtering process, the CVD process or the like so that it may become substantially even with the upper surface of the Si protrusion 21. Although the filling insulator film 23 which is substantially flat is obtained with the bias sputtering process, the SiO2 is thickly deposited also on the Si protrusion 21 by the CVD process. Therefore, after the deposition, the whole surface is coated with an organic resin or the like, the surface of the resin is flattened, and a dry etching process whose etching rates for the resin and the filling insulator film 23 are close is used to etch the whole surface until the surface of the Si protrusion 21 is substantially exposed. Thus, the SiO2 can be buried as the filling insulator film 23 essentially flatly.

Thereafter, As or P is accelerated to 60–120 keV and ion-implanted by approximately $5 \times 10^{15} - 2 \times 10^{16}$ atoms/cm$^2$, whereby a source-drain junction layer 15 being an n+-type layer can be formed. Further, a second inter-layer insulator film 14 which is represented by a CVD SiO2 film containing P by 4–10 mol-% (shortly termed "CVD PSG") is deposited to a thickness of 300–1000 nm, and it is annealed at 900°–1000° C. so as to be densified. Subsequently, an electrode contact hole 9 reaching the n+-type layer 15 is formed, and an electrode 3 typically made of Al is selectively deposited. In this way, the one-transistor type dynamic memory cell in which the side wall of the etched recess 17 is principally used for the capacitor can be constructed.

Figure 14:
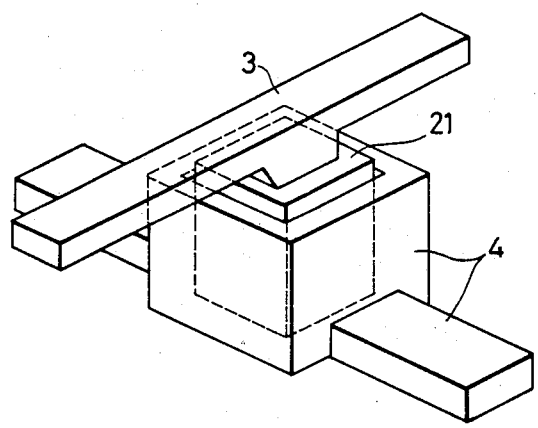

FIG. 14 shows a bird's-eye view of the memory cell of this embodiment. In order to avoid undue complexity in the illustration, only the Si protrusion 21, word line 4 and bit line 3 are extracted and depicted.

Figure 15:
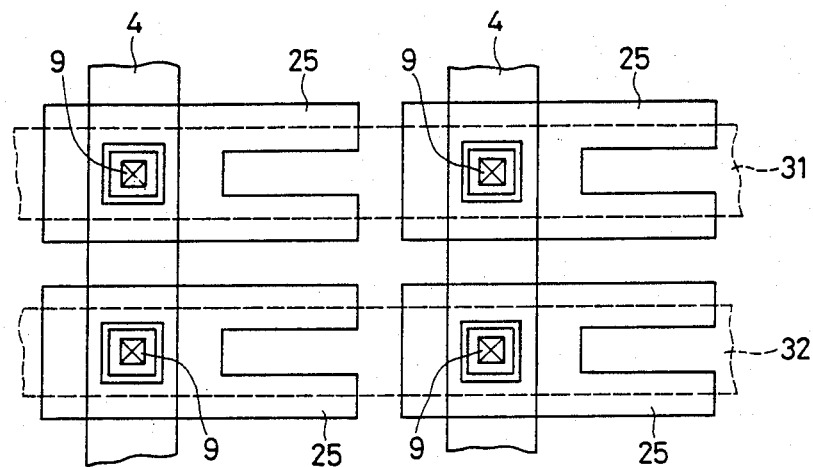

When pairs of such memory cells are to be brought into a plurality of arrays, they may be arranged as shown in FIG. 6. While this embodiment is of the folded bit line arrangement, an embodiment of the present invention having the open bit line arrangement is shown in FIG. 15. Since the open bit line arrangement may only have half the total number of the word lines 4 as compared with the folded bit line arrangement, it is advantageous when only this point is considered. However, it has the a disadvantage that noise hampering the normal operation of the circuit is relatively great.

In the present embodiment, after the desired part of the SOI portion on the whole surface is single-crystallized, the unnecessary part has been removed. However, it can be similarly performed that polycrystalline Si is deposited on the whole surface, that the unnecessary part is previously removed, and that the desired part is thereafter single-crystallized by the foregoing laser annealing or the like.

Figure 16:
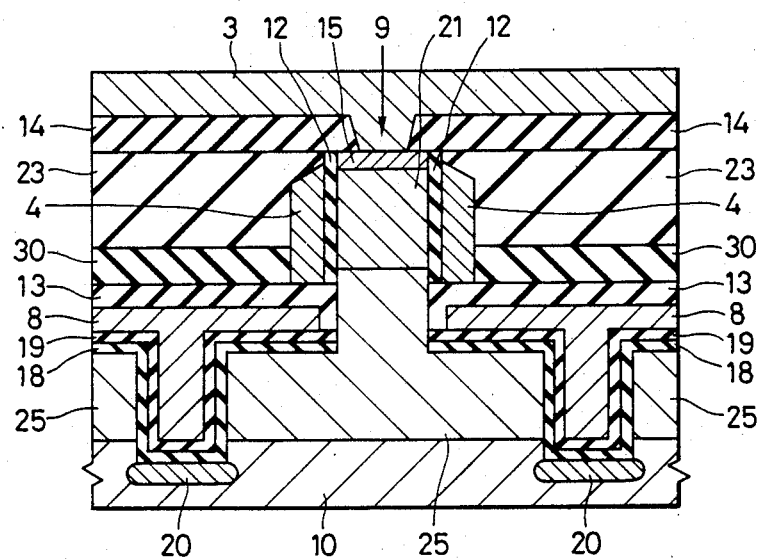

The present embodiment has employed the method in which the unnecessary polycrystalline Si other than the part to become the word line 4 is removed, but there is a method in which the unnecessary portion is partially changed into an oxide film as in another embodiment of the present invention to be described below. The polycrystalline Si of the word line 4 (serving also as the gate of the switching transistor) is deposited on the whole surface, whereupon an Si3N4 film is selectively deposited on that part of the polycrystalline Si which is to be left. Thereafter, wet oxidation at 800°–1100° C. is performed, and the Si3N4 film is removed. Then, a polycrystalline Si oxide film 30 is obtained as shown in FIG. 16.

Since the present embodiment changes the unnecessary polycrystalline Si into the oxide film, it involves a smaller step or level difference than in the case of removing the unnecessary polycrystalline Si, and it is advantageous for the formation of various films to be deposited on the polycrystalline Si.

The embodiments of the present invention thus far described have exemplified the use of the Si single-crystal substrate 10 which is usually 300–500 μm thick. However, when an SOS (Si-On-Sapphire or Si-On-Spinel) substrate is employed as in another embodiment shown in FIG. 17, the capacitor electrode of the n+-type layer 25 can be formed on an insulating substrate 31. This is convenient in that, when the bottom of the recess 17 reaches the surface of the insulating substrate 31, the adjacent capacitor electrodes 25 can be electrically isolated automatically. Charges attributed to x-rays inciding in this case are created within the capacitor electrode being the n+-type layer 25. Since, however, they are electron-hole pairs, they are electrically neutral and hardly form noise. Moreover, owing to the n+-type layer, the created electron-hole pairs are extinguished rapidly.

Any of the embodiments of the present invention described above is the memory cell including the capacitor 1 which has the capacitor electrode 25 and which is constructed of the (plate 8) - (capacitor $Si_3N_4$ film 19 + capacitor $SiO_2$ film 18) - (capacitor electrode 25). Accordingly, the potential of the plate 8 can fundamentally be determined at will, but the ground potential is convenient in point of noise.

Meanwhile, the capacitor 1 can also be constructed of a MOS (Metal-Oxide-Semiconductor) capacitor which utilizes the so-called inversion layer. That is, the capacitor electrode 25 may be removed from the structure of FIG. 13, FIG. 16 or FIG. 17 and replaced with the p-type Si substrate 10. By way of example, FIG. 18 shows another embodiment of the present invention in which the MOS capacitor is applied to the structure of FIG. 13.

Figure 19:
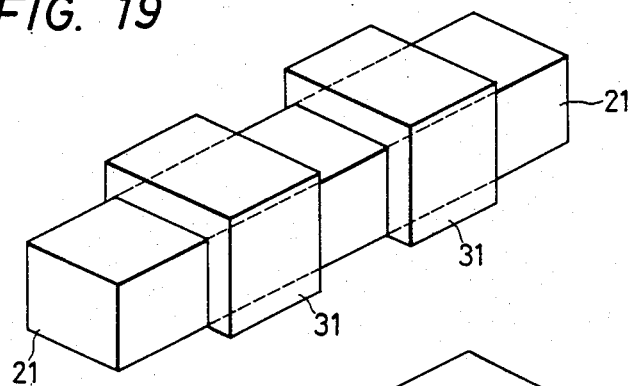
Figure 20:
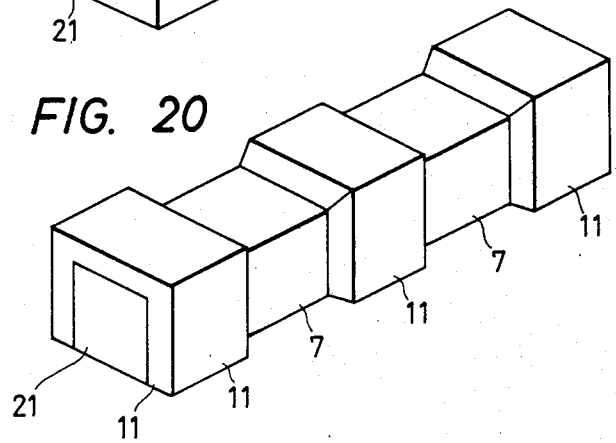
Figure 21:
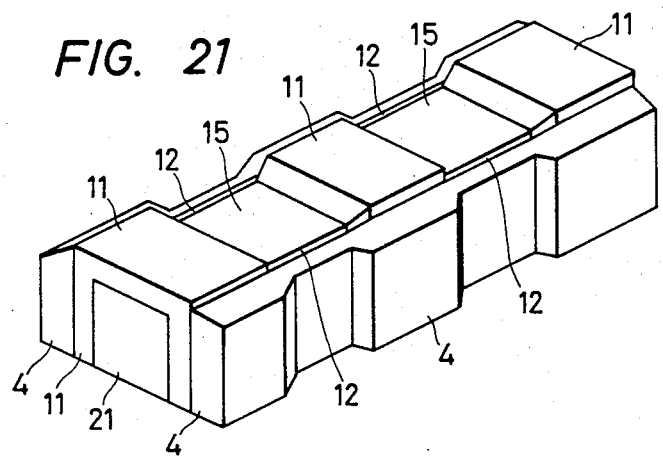

While, in any of the embodiments of the present invention thus far described, the protrusive Si portions 21 have been disposed so as to be spaced for the respective memory cells, they can be united in a number of two or more. As illustrated in FIG. 19, a protrusive Si portion 21 in the shape of a beam is formed, whereupon $Si_3N_4$ films 31 for LOCOS (LOCal Oxidation of Silicon) are selectively deposited so as to stride over the beam. Thereafter, as illustrated in FIG. 20, field oxide films 11 are formed by wet oxidation at 900°–1100° C., and the $Si_3N_4$ films 31 are removed. Then, the protrusive Si portions are spacedly obtained. In the figure, an example in which the three divided Si portions are formed is illustrated. Those parts of the beam on which the $Si_3N_4$ films 31 have been deposited will form transistors later as active regions 7. Ordinarily, with the LOCOS process, the regions on which the $Si_3N_4$ films 31 are not deposited are doped with channel stoppers of boron or the like by the ion implantation, the BN diffusion process or the like.

Thereafter, gate oxide films 12 which are 10–50 nm thick are formed by oxidization which employs dry oxygen at 800°–1150° C. containing 1–5% of HCl. Subsequently, in order to attain a desired threshold voltage $V_{TH}$, boron is ion-implanted in a necessary amount. Subsequently, a single layer of polycrystalline Si, silicide ($Mo_2Si_2$, $Ta_2O_5$) or the like or a stacked film of such materials, a refractory metal such as W or Mo, or the like is deposited on the whole structure, and the whole surface is etched by direction dry etching. Then, word lines 4 can be deposited along the beam of the protrusive Si portion 21 and on the side surfaces thereof. According to this embodiment of the present invention, the continuous word lines 4 can be formed by the self-alignment process, so that the manufacturing method is simpler than in the case of forming the word line connecting portions 45 by photolithography as illustrated in FIG. 12. By the way, W or the like deposited by the sputtering does not exhibit a good state of deposition on the side surfaces. Therefore, polycrystalline Si is once deposited on the side surfaces, and W is deposited thereon with $WF_6$ and $H_2$ gases by CVD. Then, the W is deposited on only the polycrystalline Si, and word lines 4 of low resistivity and good quality can be formed. Thereafter, when As or P is accelerated to 60–120 keV and is ion-implanted to the extent of $5 \times 10^{15} - 2 \times 10^{16}/cm^2$, n+-type source-drain junction layers 15 are formed on the parts on which the field oxide films 11 are not deposited. Besides, when the field oxide films 11 formed by the LOCOS process are sufficiently thick, the protrusive Si portions 21 can be changed into $SiO_2$ entirely in the widthwise direction, so that switching transistors 2 can be spacedly formed without resorting to etching. According to this measure, the adjacent switching transistors can be isolated by the field oxide film of $SiO_2$, and hence, capacitances parasitic to each other decrease, which is advantageous for a circuit operation.

Figure 22:
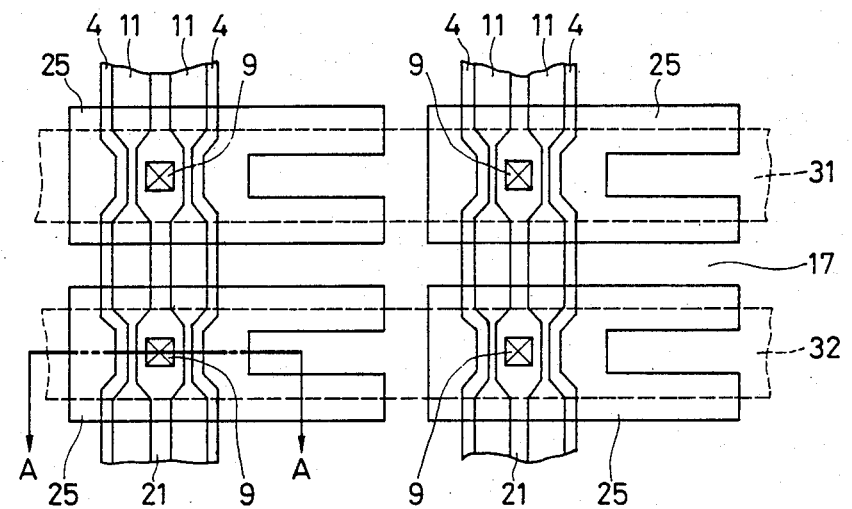

A plan view of a memory cell array employing an embodiment of the present invention is shown in FIG. 22. For the sake of convenience, the open bit line arrangement is used. A section AA is the same as shown in FIG. 7.

Figure 23:
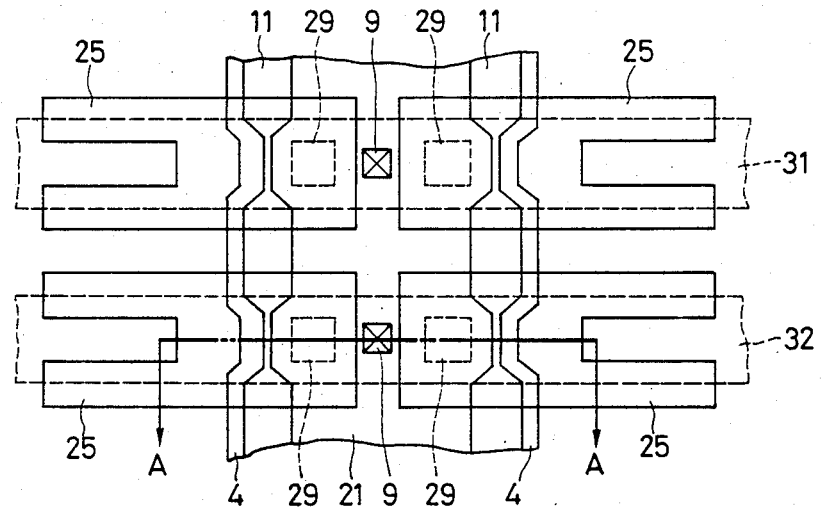
Figure 24:
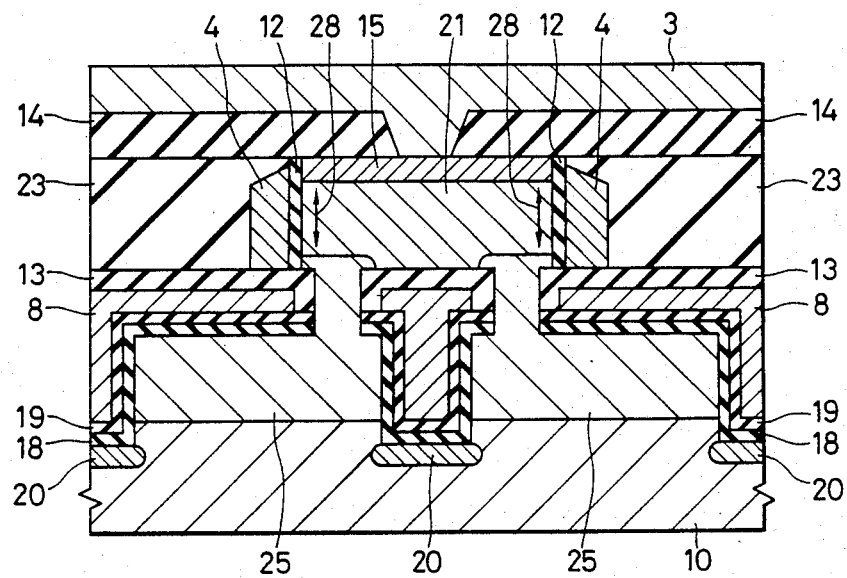

Any embodiment of the present invention described above has one protrusion in one memory cell. Alternatively, it has the protrusive Si portions continuous in the direction of the word line 4 as illustrated in FIG. 22. When the present invention is further expanded, a protrusive Si portion which strides over two cells in the direction of a bit line 3 is employed, whereby a still higher density can be attained. FIG. 23 shows a plan view of such measure. Right and left memory cells are connected by the protrusive Si portion 21 through contact holes 29 to a substrate. In the direction of the word line 4, the protrusive Si portions are continued as in the embodiment shown in FIG. 22. Thus, one contact hole 9 can be shared by the two, right and left memory cells, which is advantageous for attaining a still higher density. A section AA indicated in FIG. 23 is shown in FIG. 24. Switching transistor channel portions 28 are comprised at the right and left of the united protrusive Si portion 21, and a signal is written into or read out from the bit line 3 which is electrically connected to a united diffused layer 15.

Figure 17:
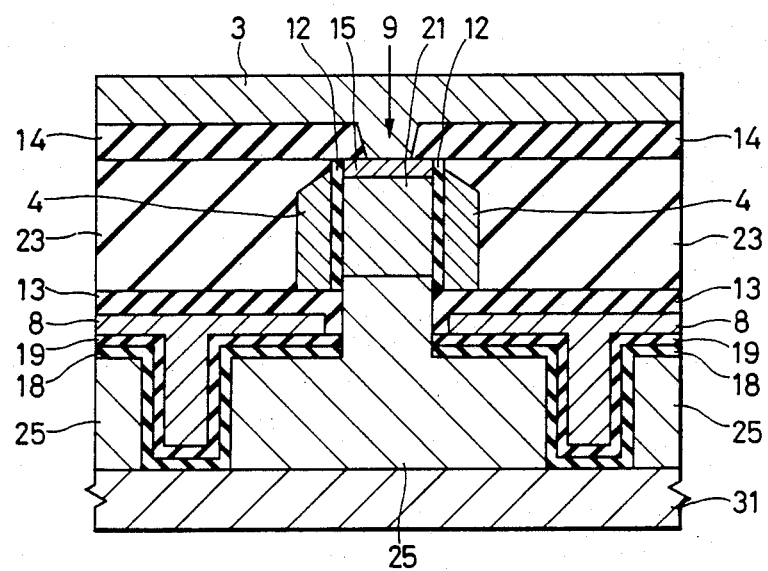
Figure 18:
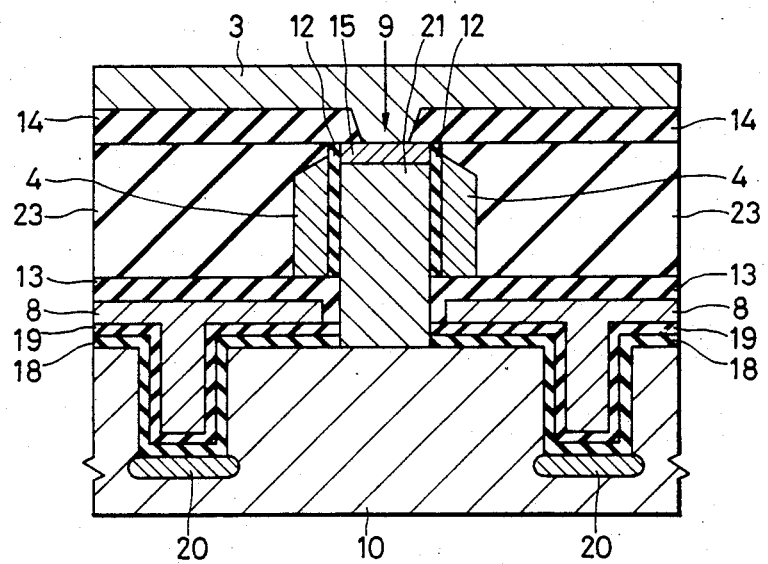

While the present embodiment has employed the structure shown in FIG. 13, it is also possible to apply the structure shown in FIG. 16 in which the polycrystalline Si is oxidized by LOCOS, the structure shown in FIG. 17 in which the insulating substrate 31 is employed, the method illustrated in FIG. 18 in which the MOS inversion layer is utilized for the capacitor, etc.

Figure 25:
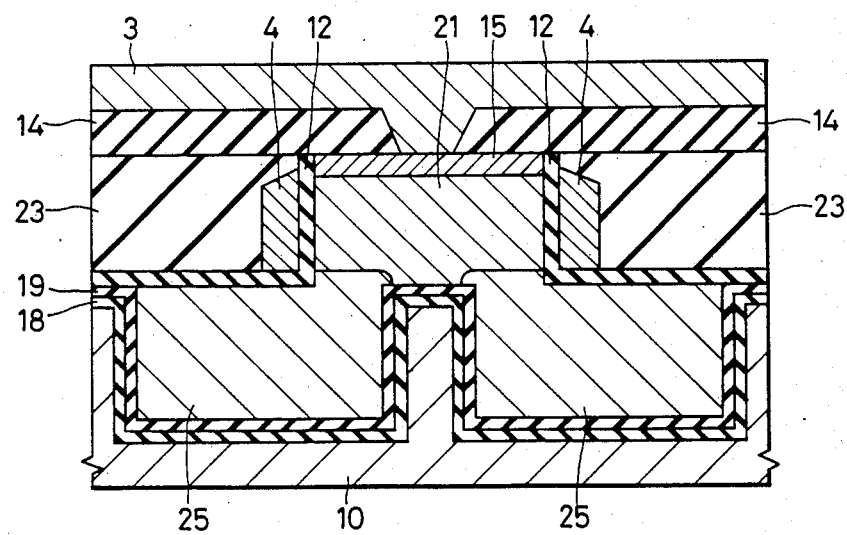

In the embodiments of the present invention thus far described, any capacitor electrode 25 has been exemplified as being a part of the Si substrate. However, there is also a structure wherein, as in another embodiment of the present invention shown in FIG. 25, capacitor electrodes 25 are buried in the recess of an n-type Si substrate 10 through a capacitor $SiO_2$ film 18 as well as a capacitor $Si_3N_4$ film 19. Since the Si substrate 10 constructs a capacitor along with the capacitor electrode 25 being an n+-type layer, it is rendered the n-type so that a depletion layer may not be formed in the surface of the Si substrate 10 opposing to the capacitor electrode 25 even when this capacitor electrode comes to have a positive potential. Accordingly, when the Si substrate 10 is rendered the p-type, the impurity concentration thereof may be made very high so as not to form a depletion layer, or only the Si substrate surface 10 to which the capacitor electrode 25 opposes may be rendered the n-type.

Figure 26:
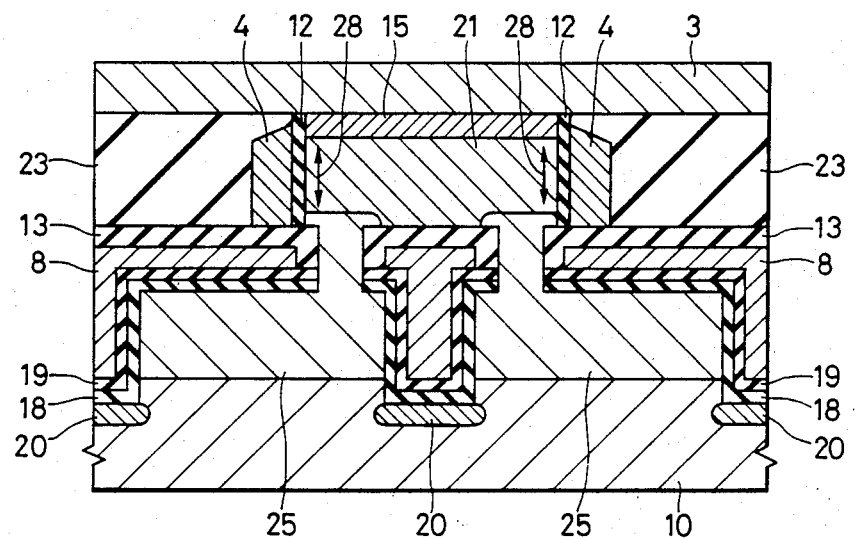

In any of the embodiments of the present invention described above, the contact hole 9 has been formed in the second inter-layer insulator film 14, and the bit line 3 has been formed therethrough. On the other hand, the $n^+$-type diffused layer 15 is entirely surrounded with the filling insulator film 23. As shown in FIG. 26, therefore, when the bit line 3 is selectively formed directly without depositing the second inter-layer insulator film 14, it can be electrically connected to the diffused layer 15 in self-alignment fashion. In addition, when the bit line 3 is made of polycrystalline Si, the diffused layer 15 can be formed by diffusing P or As from above the polycrystalline Si. Since the present embodiment can omit the step of forming the contact holes 9 and the step of forming the second inter-layer insulator film, it is advantageous for simplifying the manufacturing method and enhancing the packaging density. The present structure is applicable to all of the various embodiments of the present invention.

Figure 27:
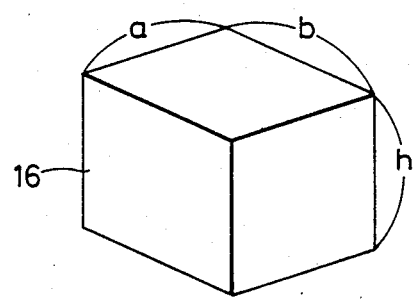

Although the capacitor electrode of the memory cell stated in the present embodiment has been concave, the simplest shape is a rectangular parallelepiped shown in FIG. 27. Let $a \times b$ denote the upper surface of this rectangular parallelepiped, and h denote the depth thereof. The area of the capacitor region 16 of the prior-art planar-memory cell shown in FIG. 4 is $a \times b$. In contrast, in the embodiment of the present invention, the side surfaces can also be utilized, and hence, the area of the capacitor region totals $ab + 2h(a+b)$. Assuming $a = b = 5$ $\mu m$ and $h = 2$ $\mu m$, the capacitor region of the prior-art memory cell is $A_{CONV} = 25$ $\mu m^2$, whereas the capacitor region of the memory cell of the present invention becomes $A = 65$ $\mu m^2$ $(=5 \times 5 + 2 \times 2(5+5))$. Thus, the capacitor area which is several times larger can be readily attained without expanding the plane area. This also indicates that, when the capacitor areas are equal, the present invention can reduce the plane area, and the invention can be said very advantageous for enlarging the scale of a memory.

Figure 28:
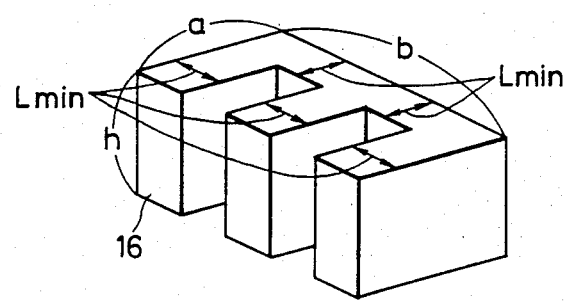

In the embodiments of the present invention described above, the capacitor of the memory cell has fundamentally been the rectangular parallelepiped shown in FIG. 27. The subject matter of the present invention is to utilize the side walls of the recess 17 dug in the Si substrate. Therefore, when the rectangular parallelepiped is formed with indents as shown in FIG. 28, the capacitor area A can be further increased. The minimum dimension of processing is denoted by $L_{min}$, which is assumed 1 $\mu m$. When the values a, b and h are examples indicated in FIG. 28, the upper surface becomes 17 $\mu m^2$, the side surfaces become 72 $\mu m^2$, and the total capacitor area A becomes $A = 89$ $\mu m^2$. This embodiment has attained the still larger capacitor area than in the embodiment shown in FIG. 27.

Figure 29:
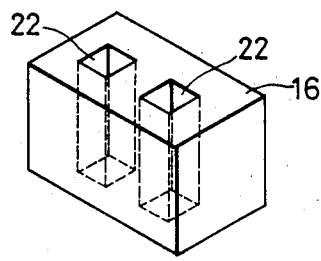
Figure 30:
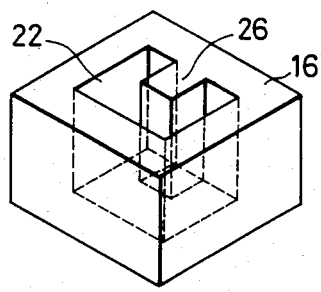
Figure 31:
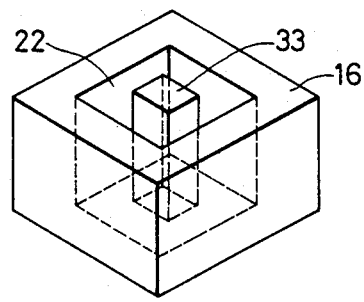

In this manner, when the comb-like indents are employed in order to fully exploit the subject matter of the present invention, the effect is more enhanced. Apart from the comb-like indents, it is also effective to provide a new groove in the rectangular parallelepiped shown in FIG. 27. FIGS. 29-31 show further embodiments of the present invention. FIG. 29 illustrates a case where one or two slots 22 are provided; FIG. 30 a case where one hole is provided in which an inward protrusion 26 is formed; and FIG. 31 a case where an island-like strut 33 is formed in a hole. In any case, the dimensions of various parts may be set at the minimum dimension which can be processed.

The present invention thus far described has the skeleton that the switching transistor 2 is formed perpendicularly to the Si substrate 10. Accordingly, the technology of forming the protrusive protion 21 of single-crystal Si of high quality becomes a key. In particular, the SOI (Silicon On Insulator) technology in which the single-crystal Si is grown on an insulator film typically of $SiO_2$, $Si_3N_4$, $Al_2O_3$, spinel or the like is important. The SOI technology well suited for application to the present invention will now be described.

Figure 32:
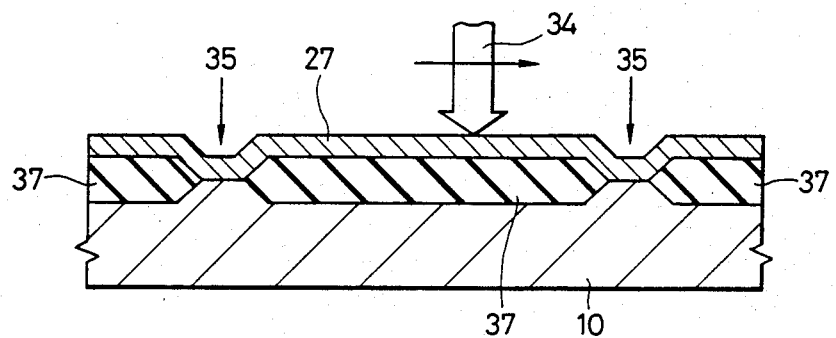

In general, polycrystalline Si or an amorphous Si film is deposited on the aforementioned insulator film, and the Si film is once melted by a laser, an electron beam or heat. As the melted film solidifies, Si is single-crystallized. However, when the underlying insulator film is not a single crystal, the orientations of Si to solidify are difficult of settling in both the vertical direction and the horizontal direction. Meanwhile, as shown in FIG. 32, underlying insulator films 37 typically made of $SiO_2$ are selectively deposited on a Si substrate 10. Parts where the underlying insulator films 37 are not deposited are seed crystal portions 35 where the Si substrate 10 is exposed. An SOI layer 27 which is a single-crystal layer having the same orientation as that of the surface of the Si substrate 10 is grown from the seed crystal portions 35, while following up the scanning of a beam 34. On this occasion, as the scanning position becomes far from the seed crystal portion 35, the single crystal becomes difficult to grow continuously. Accordingly, when an area in which the single crystal grows satisfactorily is exceeded, the seed crystal portion 35 needs to be formed again.

Figure 33:
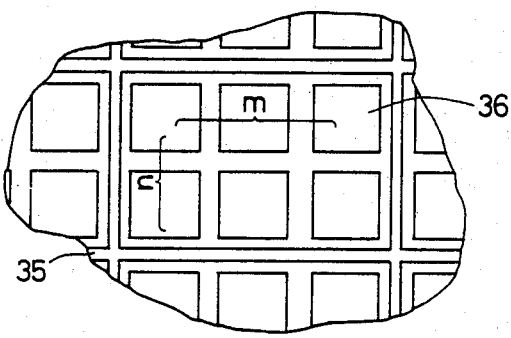
Figure 34:
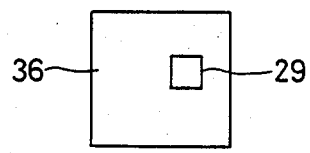

As an embodiment of the present invention is shown in FIG. 33, therefore, the seed crystal portion 35 surrounding the matrix of $m \times n$ (in the figure, $3 \times 3$) unit memory cells 36 may be formed so as to render the entire internal part the same single crystal as that of the Si substrate 10 from this portion. In this case, a substrate contact hole 29 which is a connection portion with a capacitor electrode 25 may be provided in at least one place within the memory cell 36 as shown in FIG. 34. As the value $m \times n$ is greater, the number of the unnecessary parts of the seed crystal portions 35 may be smaller. $1 \times 1$ can be set as the smallest value, that is, the seed crystal portion 35 surrounding each memory cell can be provided. This aspect differs depending upon the SOI forming method.

In the embodiments of the present invention thus far described, the two-layer film consisting of the $SiO_2$ film 18 and the $Si_3N_4$ film 19 has been employed as the capacitor insulator film. However, when the upper surface of the $Si_3N_4$ film is partly oxidized to form an $SiO_2$ film, a three-layer film of $SiO_2/Si_3N_4/SiO_2$ can be formed. This film is especially high in the dielectric breakdown voltage and good in quality, and is applicable to all the embodiments of the present invention. Besides, other insulator films, for example, high permittivity films of $Ta_2O_5$, $TiO_2$ and $Al_2O_3$ can increase the capacitance per unit area and are advantageous for the microminiaturization of memory cells.

The foregoing embodiments have been selected from among processes of many choices. Accordingly, each step has various substitute measures. The present invention, however, consistently has the basic concept that the side walls of a recess formed in a substrate are utilized as a part of a capacitor. For example, the foregoing method of forming the substrate contact hole 29 can be adopted because the upper layer of the capacitor insulator film is formed of the $Si_3N_4$ film 19, which is not oxidized during the oxidization of the plate 8 of polycrystalline Si.

Figure 35:
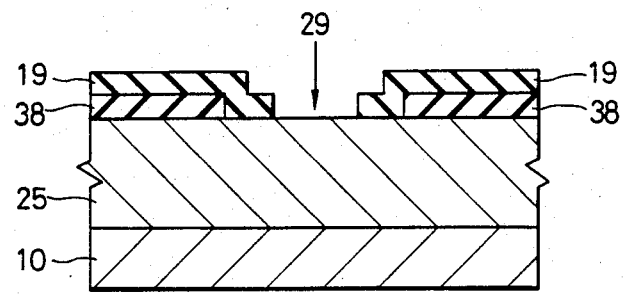

When, as illustrated in FIG. 35 by way of example, the capacitor insulator film is an oxidation non-impermeable film 38 which is made of $Ta_2O_5$ or NbO and which cannot endure a treatment at 800°–1000° C. in an oxygen atmosphere, the first inter-layer insulator film cannot be formed by oxidizing the polycrystalline Si plate 8. Therefore, an oxidation resistant first inter-layer insulator film 39 which is represented by an $Si_3N_4$ film is deposited so as to cover the end part of the oxidation non-resistant film 38 as shown in FIG. 35. At this time, the substrate contact hole 29 requires pattern alignment separately from the holes of the plate 8 and the oxidation non-resistant insulator film, and alignment margins are required between these holes. The same method can be adopted even for the oxidation resistant capacitor insulator film.

The present invention has been so explained that the word line 4 forms the gates continuous within the memory cell array. However, there is also a method in which one or more transfer gates of polycrystalline Si within memory cells are connected by the word line 4 of Al or the like through one or more contact holes. Thus, the switching time of a high-speed memory can be attained owing to the reliability of the polycrystalline Si gates having heretofore produced many actual results and the low resistivity of the Al or the like.

As stated in the introductory part, although the present invention has been explained by the use of the n-channel type MOS transistors, the p-channel type can be achieved by reversing the conductivity types of all the impurities. By way of examples, P or As may be replaced with B or Al, and B with P, As or Sb.

In the above, the present invention has been described in conjunction with the detailed embodiments. With the present invention in which the switching transistors are formed perpendicularly to the substrate plane, the increase of the capacitor capacitance $C_S$ which is ten times or more higher than in the prior-art memory cell can be expected in the same plane area. In actuality, the shape of the recess is not composed of perfectly erect planes, but it is somewhat rounded. Moreover, even when the design shape is a regular square, the actual shape sometimes becomes circular on account of the degradation of the resolution of lithography in a very fine part. Even in such cases, decrease in the capacitance $C_S$ amounts to 10–20%.

When the capacitance $C_S$ has increased by 10%, the malfunctions of a dynamic memory ascribable to x-rays are improved one order or more in many cases. Therefore, the increase of the capacitance $C_S$ which is two times or more, not only enhances the reliability of the memory of a specified scale, but also makes it possible to realize a memory of a still larger scale.

While the present invention concerns memory cells, an actual dynamic RAM requires a peripheral circuit besides a memory array in which the memory cells are arranged in the shape of a matrix. The peripheral circuit is constructed of transistors, resistors, capacitors etc. Particularly the transistors of the peripheral circuit may be the vertical transistors of the present invention, or conventional lateral transistors can be formed on the surface of the Si substrate 10 or the SOI layer 21. The part in which the transistor of the peripheral circuit is formed, depends upon the circuit design and cannot be restricted.

Figure 1:
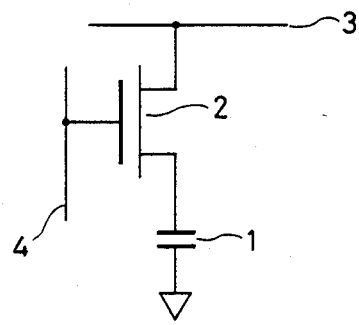
FIGS. 1-5 are diagrams for explaining memory cells in prior art arrangements.
Figure 2:
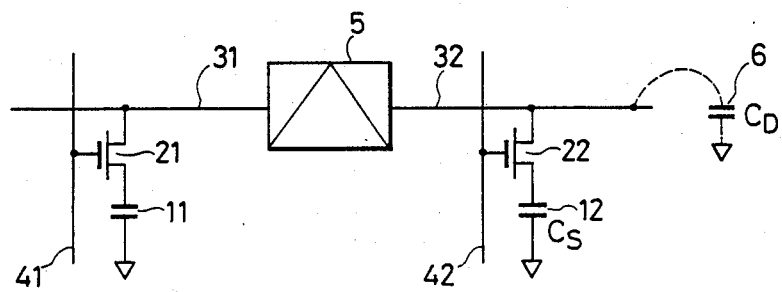
Figure 3:
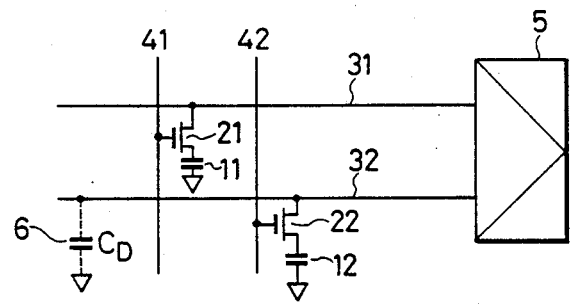
Figure 36:
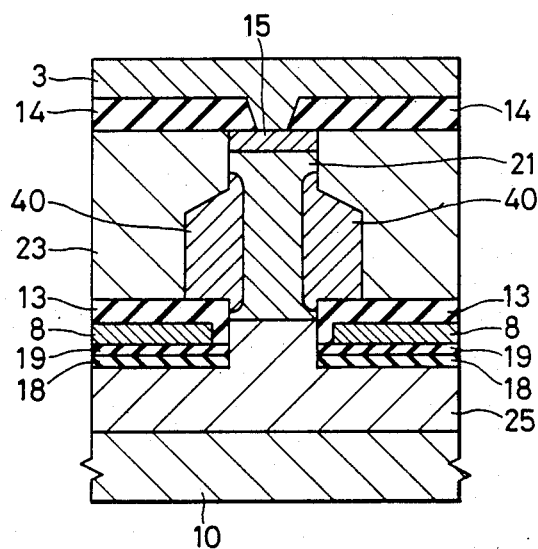

The switching transistor in the present invention has been the MOS type which is one sort of the so-called MIS type. In principle, however, any device having the switching characteristic can be employed. Specifically, another embodiment of the present invention shown in FIG. 36 corresponds to a case of employing a junction type FET (field effect transistor). It includes an $n^+$-type capacitor electrode, a diffused layer 15 as well as an n-type protrusive Si portion 21, and a junction gate 40 which forms a p-n junction between them, and it is applicable to all the embodiments and measures explained in and before FIG. 35. In the application, the MOS type transistors may be replaced with the junction type transistors. In order to avoid complicacy, FIG. 36 shows the portion of the switching transistor 2 and a part of the capacitor electrode 25. Naturally, since the transistors in FIGS. 1–3 are denoted by the symbols of MIS type transistors, they need to be denoted by the symbols of junction type transistors instead.

Figure 37:
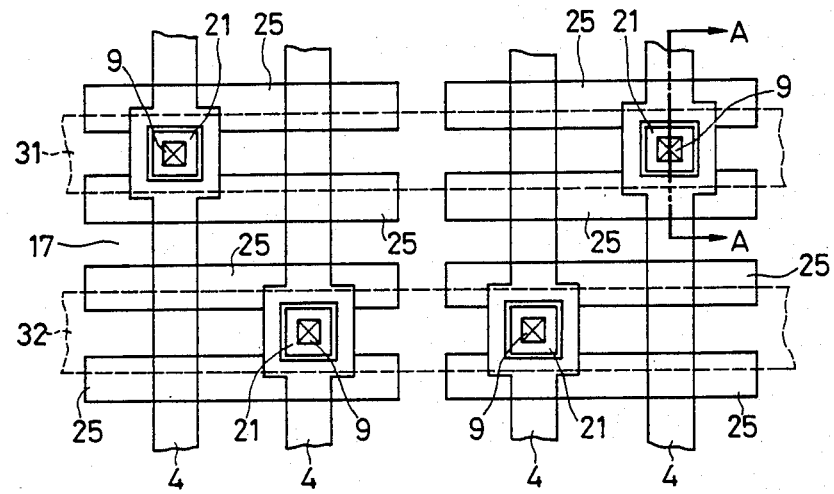

Further, another embodiment of the present invention will be described. FIG. 37 shows a plan view of this embodiment. When compared with the prior-art memory cells shown in FIG. 4, the embodiment differs in that all capacitor electrodes 25 are formed so as to cover the whole front surface of a Si substrate and the vicinity thereof and that the channel portions of switching transistors 2 are formed by the use of the side walls of protrusive Si portions 21 which are stacked on the capacitor electrodes 25. Thus, as compared with the capacitor region 16 of the prior-art memory cell which has hitherto occupied only 30–40% of the whole plane as shown in FIG. 4, that of the embodiment is sharply enhanced and can occupy approximately 80–90% of the whole plane. Since, as described later, the capacitor region 25 utilizes the side wall part of a recess 17 dug in the Si substrate, the area of the capacitor electrode can be expanded independently of the plane area. It is intended to increase the side wall area that the capacitor electrodes 25 numbering two are formed in FIG. 37.

Figure 38:
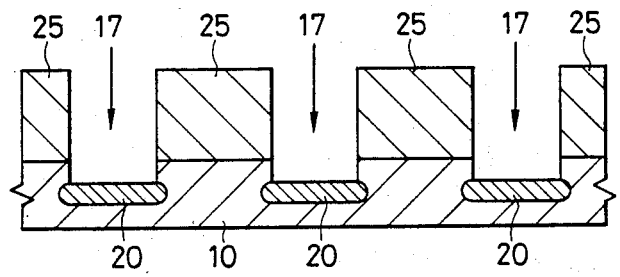

Now, the manufacturing process of the present invention will be described in detail. First, a structure shown in FIG. 38 is produced by steps similar to those in FIG. 8.

Figure 39:
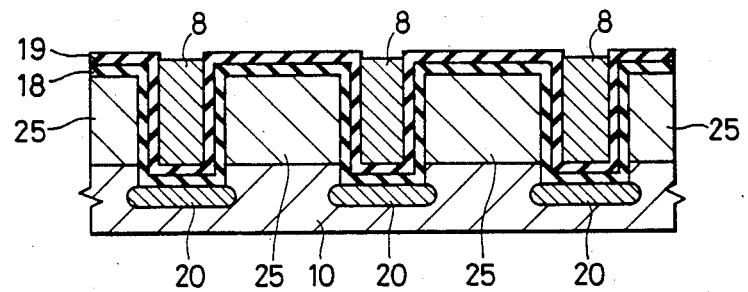

Thereafter, likewise to the steps in FIG. 9, polycrystalline Si is deposited, and the plasma etching of the polycrystalline Si is performed on the whole surface, whereby plates 8 of polycrystalline Si are left in only the parts of the recesses 17 as shown in FIG. 39. In this case, the plate 8 is not deposited on the corner of the upper end part of the recess. Therefore, the drawback is not involved that the dielectric breakdown voltage degrades due to the concentration of electric fields in the part of the acute angle. It is not required, either, to round the corner by employing isotropic etching such as wet etching, before the recess is formed deep.

Figure 40:
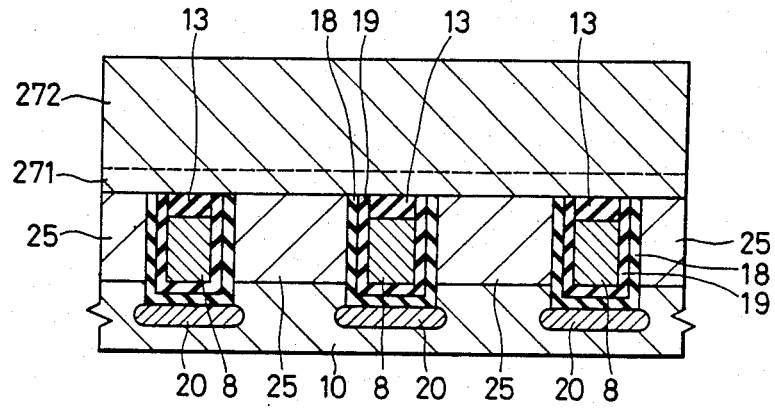

Thereafter, as shown in FIG. 40, the polycrystalline Si is oxidized to form a first inter-layer oxide film 13 which is 100–400 nm thick. On this occasion, the $Si_3N_4$ film 19 is hardly oxidized. Subsequently, using the thick first inter-layer oxide film 13 as a mask, the $Si_3N_4$ film 19 and the thin $SiO_2$ film 18 are etched and removed. Likewise to the steps in FIG. 10, an SOI (Si-On-Insulator) layer 27 (271, 272) is formed on the resultant structure.

Figure 41:
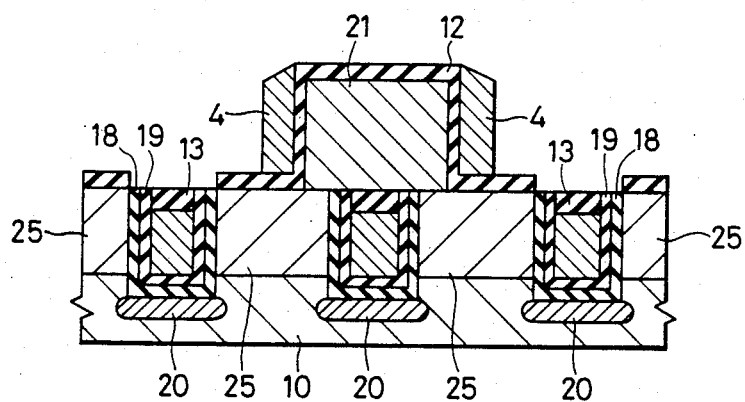

Thereafter, as shown in FIG. 41, the unnecessary SOI layer is removed by etching the structure with the well-known photolithography or the like so as to leave at least the pillar-like Si protrusion 21 which is to form the switching transistor.

The description of the present embodiment has referred to the case where the Si protrusion 21 is vertically formed as shown in FIG. 41. Thereafter, a gate oxide film 12 is formed by the well-known thermal oxidation or the like, boron is ion-implanted in an amount required for attaining a desired threshold voltage $V_{TH}$, and a word line 4 is selectively deposited.

The word line 4 which serves as the gate of the switching transistor 2 and which is typically made of polycrystalline Si, or W or Mo, or such silicide as $WSi_2$, $MoSi_2$ or $TiSi_2$, is deposited on the side surfaces of the Si protrusion 21 by steps similar to those in FIG. 11.

Figure 42:
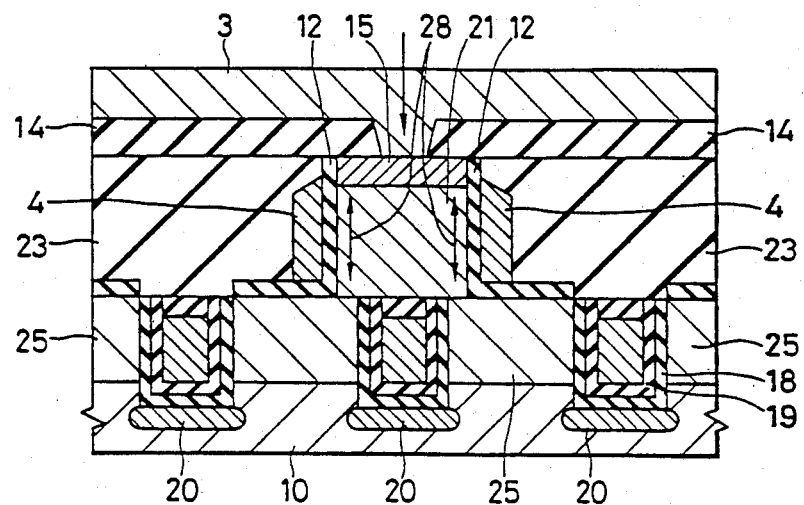

Thereafter, as shown in FIG. 42, likewise to the steps in FIG. 13, a filling insulator film 23 typically made of $SiO_2$ containing or not containing P is deposited by the bias sputtering process, the CVD process or the like so that it may become substantially even with the upper surface of the Si protrusion 21.

Thereafter, As or P is accelerated to 60–120 keV and ion-implanted by approximately $5 \times 10^{15} - 2 \times 10^{16}$ atoms/cm$^2$, whereby a source-drain junction layer 15 being an n$^+$-type layer can be formed. Further, a second inter-layer insulator film 14 which is represented by a CVD $SiO_2$ film containing P by 4–10 mol-% (shortly termed "CVD PSG") is deposited to a thickness of 300–1000 nm, and it is annealed at 900°–1000° C. so as to be densified. Subsequently, an electrode contact hole 9 reaching the n$^+$-type layer 15 is formed, and an electrode 3 typically made of Al is selectively deposited. In this way, the one-transistor type dynamic memory cell in which the side walls of the etched recess 17 are principally used for the capacitor can be constructed.

When pairs of such memory cells are to be brought into a plurality of arrays, they may be arranged as shown in FIG. 37. This embodiment is of the folded bit line arrangement. Since the open bit line arrangement may be half in the arrayal number of the word lines 4 as compared with the folded bit line arrangement, an embodiment of the present invention having the open bit line arrangement is advantageous when only this point is noticed. However, it has the disadvantage that noise hampering the normal operation of the circuit is relatively great.

FIG. 42 shows the section AA of the plane pattern depicted in FIG. 37. A plate 8 is buried in the recess 17 dug in the Si substrate 10, through a capacitor $SiO_2$ film 18 as well as a capacitor $Si_3N_4$ film 19. A part of the plate is removed, and the Si protrusion 21 is disposed on the capacitor electrode 25 of the n$^+$-type layer through the removed part. A word line 4 serving as a gate is formed along the protrusion 21 through a gate oxide film 12. A bit line 3 is electrically connected to an n$^+$-type diffused layer 15 through a contact hole 9. Thus, the switching transistor 2 can use the side walls of the Si protrusion 21 as the channel portion 28 thereof.

Figure 43:
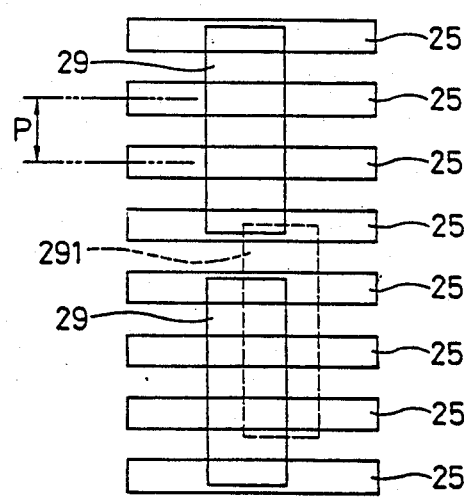

The description of the present invention has referred to the case where, as illustrated in FIGS. 37 and 41, the two capacitor electrodes 25 electrically isolated from each other are coupled by the single switching transistor. However, when the capacitor electrodes 25 are coupled in a number of three or more, the capacitor capacitance per unit plane area can be further increased. As shown by one embodiment of the present invention in FIG. 43, four capacitor electrodes 25 are coupled by a capacitor electrode contact portion 29 which leads to the Si strut 21 constituting the switching transistor 2. This embodiment also has the following subsidiary effect. When the dimensions of the capacitor electrode 25 are as sufficiently small as below several tenths of the dimensions of the electrode contact portion 29 (that is, the pitch P of the capacitor electrodes 25 is sufficiently smaller than that of the contact portions 29), a sufficient mask alignment margin m need not be taken for the capacitor electrodes 25. In other words, in a case where m is greater than P, namely, in a case where the contact portion to be connected to the adjoining capacitor electrode 25 beyond one capacitor electrode 25 is located as a contact portion 291 indicated by a broken line in FIG. 43, four capacitor electrodes 25 are still connected. That is, when the capacitor electrode 25 is made sufficiently smaller than the capacitor electrode contact portion 29, it is almost unnecessary to consider the registration between the capacitor electrodes 25 and the capacitor electrode contact portion 29. This is effective for enhancing the packaging density.

Listed below are symbols in the drawings.

1, 11, 12... capacitors, 2, 21, 22... switching transistors, 3, 31, 32... bit lines, 4, 41, 42... word lines, 5... sense amplifiers, 6... parasitic capacitance, 7... active region, 8... plate, 9... contact hole, 10... Si substrate, 11... field oxide film, 12... gate oxide film, 13... first inter-layer insulator film, 14... second inter-layer insulator film, 15... diffused layer, 16... capacitor region, 17... recess, 18... capacitor $SiO_2$ film, 19... capacitor $Si_3N_4$ film, 20... isolation heavily-doped layer, 21... protrusive Si portion, 22... hole, 23... filling insulator film, 24... distance between a capacitor and a contact hole, 25... capacitor electrode, 26... protrusion, 27, 271, 272... single crystal layer on an insulator film (SOI layer), 28... switching transistor channel portion, 29... substrate contact hole (capacitor electrode contact portion), 30... polycrystalline Si oxide film, 31... insulating substrate, 32... $Si_3N_4$ film for LOCOS, 33... strut, 34... beam, 35... seed crystal portion, 36... unit memory cell, 37... underlying insulator film, 38... oxidation non-impermeable film, 39... oxidation impermeable first inter-layer insulator film, 40... junction gate.

What is claimed is:

1. A semiconductor random access memory formed on a semiconductor substrate, said random access memory having a plurality of memory cells which each comprise:

a capacitor including a capacitor node formed in a groove formed in the substrate, a capacitor plate formed as a portion of the substrate, and a capacitor dielectric film isolating said capacitor plate from said capacitor node; and a field effect transistor at least partially formed over said capacitor node, said field effect transistor including a semiconductor portion formed over said capacitor node, wherein a bit line is coupled to a source-drain path of said field effect transistor, wherein a word line is respectively coupled to said field effect transistor to serve as a gate electrode for the field effect transistor between said bit line and said capacitor node, wherein applying a predetermined voltage to said word line increases a channel between said capacitor node and said bit line to connect said capacitor node to said bit line, and wherein said channel extends vertically in substantially a straight line between said capacitor node and said bit line.

2. A semiconductor random access memory device structure according to claim 1, wherein the capacitor dielectric film is formed of a material selected from a group comprised of $SiO_2$, $Si_3N_4$, $Ta_2O_5$, $Ti_2O_5$ and $GrO_2$.

3. A semiconductor random access memory device structure according to claim 2, wherein the field effect transistor is a metal-oxide-semiconductor field effect transistor and wherein the word lines are formed of a material selected from a group comprised of polycrystalized silicon, W, Mo, $WSi_2$, $MoSi_2$ and $TiSi_2$.

4. A semiconductor random access memory according to claim 1, wherein said semiconductor portion has a bottom surface contacting an upper surface of said capacitor node, a side surface and an upper surface opposed to said bottom surface, wherein a region is formed in said upper surface of said semiconductor portion as one of a source or drain of said field effect transistor, wherein said bit line is formed on said region, wherein a gate insulating film is formed on said side surface of said semiconductor portion, wherein said gate electrode is formed over said gate insulating film to be separated from said side surface of said semiconductor portion, and wherein applying a predetermined voltage to said gate electrode increases a channel in said semiconductor portion between said region and said capacitor node to connect said capacitor node to said bit line.

5. A semiconductor random access memory according to claim 1, wherein said capacitor dielectric film comprises at least two insulating layers of different material from one another.

6. A semiconductor random access memory according to claim 1, wherein said capacitor plate includes a side wall portion of said groove in said substrate.

* * * * *